United States Patent [19]

Chevali

[11] 4,136,379

[45] Jan. 23, 1979

[54] PHOTOFLASH LAMP ARRAY HAVING REFLECTIVE CIRCUIT BOARD

[75] Inventor: Harihar D. Chevali, Mentor, Ohio

[73] Assignee: General Electric Company, Schenectady, N.Y.

[21] Appl. No.: 825,608

[22] Filed: Aug. 18, 1977

[51] Int. Cl.$^2$ ............................................. G03B 15/02
[52] U.S. Cl. ......................................... 362/13; 362/16; 362/17; 362/241; 362/247; 362/346
[58] Field of Search .................... 362/13, 16, 17, 241, 362/247, 346

[56] References Cited

U.S. PATENT DOCUMENTS

| 3,614,412 | 10/1971 | Bellows | 362/16 X |
| 3,725,693 | 4/1973 | Anderson et al. | 362/16 X |

*Primary Examiner*—Stephen J. Lechert, Jr.
*Attorney, Agent, or Firm*—Norman C. Fulmer; Lawrence R. Kempton; Frank L. Neuhauser

[57] ABSTRACT

A photoflash lamp array comprising a plastic housing containing flash lamps positioned over a circuit board carrying switching circuitry for sequentially firing the flash lamps. The circuit board is made of an electrically insulating material having a light-reflecting surface for reflecting light when the lamps are flashed. The front of the housing is provided with prisms to improve the distribution pattern of light when the lamps are flashed.

6 Claims, 4 Drawing Figures

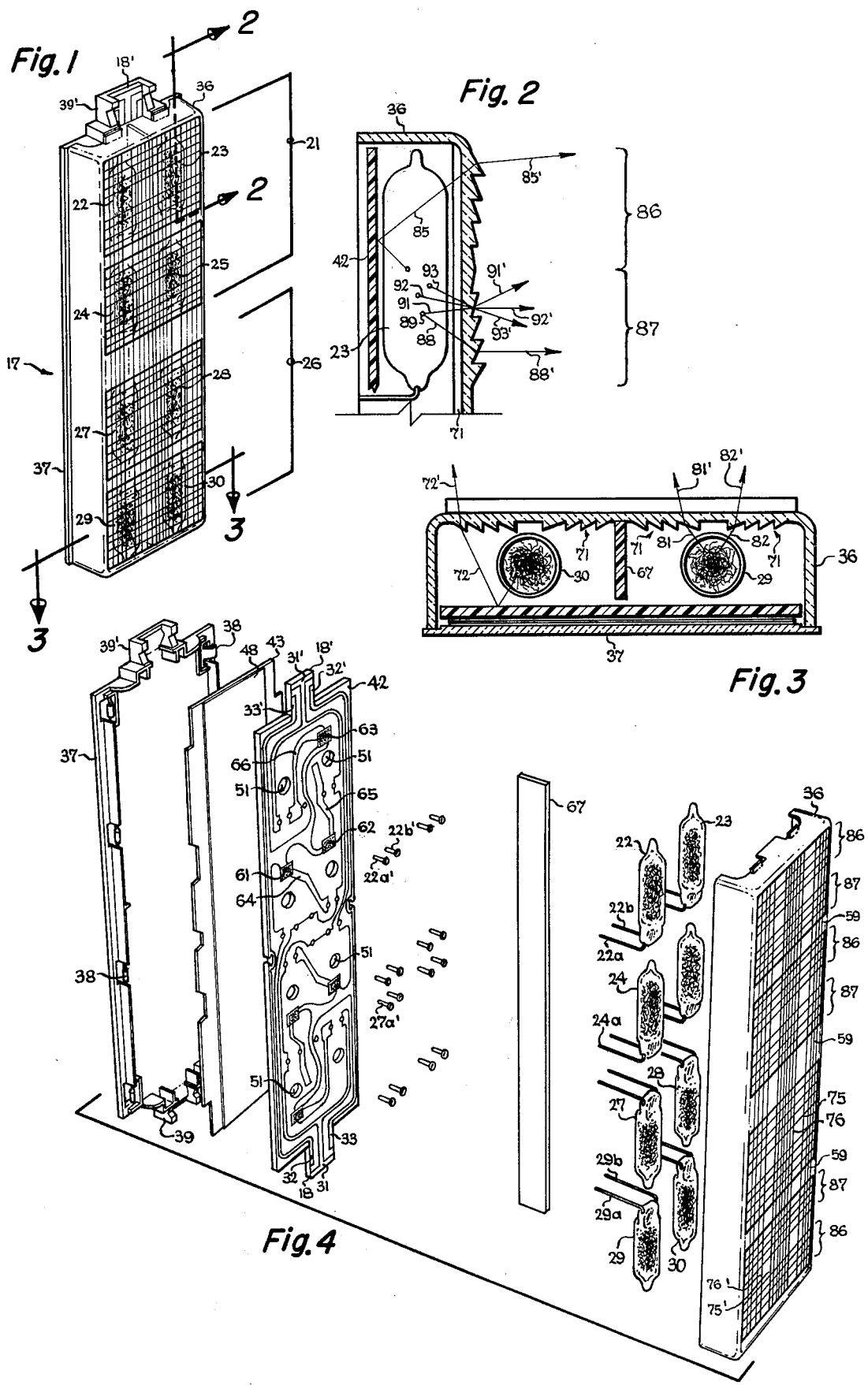

PHOTOFLASH LAMP ARRAY HAVING REFLECTIVE CIRCUIT BOARD

RELATED PATENT APPLICATIONS

Ser. No. 800,193, filed May 25, 1977, Schindler and Soules, "Photoflash Unit Having Light-Refractive Prisms," assigned the same as this invention.

Ser. No. 825,604, filed concurrently herewith, Collins, Sterling, and Chevali, "Photoflash Lamp Array Having Reflective Coating Means," assigned the same as this invention.

Ser. No. 825,607, filed concurrently herewith, Chevali, "Photoflash Lamp Array Having Reflector at Rear of Transparent Circuit Board," assigned the same as this invention.

BACKGROUND OF THE INVENTION

The invention is in the field of multiple photoflash lamp units, such as planar arrays, having reflectors behind the flash lamps.

U.S. Pat. No. 3,935,442 to Hanson discloses a multiple flash lamp array of the Flip Flash type comprising a plurality of flash lamps having their lead-in wires connected to a circuit board provided with switching circuitry for causing sequential flashing of the lamps, and a reflector unit is positioned between the lamps and the circuit board. The reflector unit may be of metal or metal-coated plastic, shaped to provide individual reflectors for the lamps. U.S. Pat. No. 3,608,451 to Kelem discloses a flash array having a reflector in the form of a metal coating on a circuit board, the circuit board being larger than the reflector coating so as to provide areas for circuit runs.

SUMMARY OF THE INVENTION

Objects of the invention are to provide an improved flash array construction, and to reduce the manufacturing cost through elimination of the need for a separate reflector member.

The invention comprises, briefly and in a preferred embondiment, a multiple flash lamp array having a plurality of flash lamps in front of and connected to a circuit board having a lamp flashing circuit on a surface thereof. The circuit board is made of electrically insulative light-reflecting material, such as polystyrene containing titanium dioxide interspersed therein, and its front surface functions as a reflector thereby eliminating the need for a separate reflector member. Electrical circuit runs may be provided on the reflective front surface of the board, these circuit runs being relatively narrow and/or of light-reflecting metal so as not to substantially adversely affect the light-reflecting ability of the circuit board. Thus, the same front area of the circuit board performs the dual functions of carrying the flash sequencing circuitry and of reflecting light from the lamps when flashed. Preferably the lamps and circuit board are contained in a housing having a transparent front cover (of plastic, for example) provided with light-refractive prisms which increase the intensity of light (both directly from the lamp when flashed and also light that is reflected by the reflective circuit board) in the picture area being photographed.

BRIEF DESCRIPTION OF THE DRAWING

FIG. 1 is a perspective view of a multiple flash lamp array in accordance with a preferred embodiment of the invention.

FIG. 2 is a partial sectional view of FIG. 1 taken on the line 2—2 therof.

FIG. 3 is a partial sectional view of FIG. 1 taken on line 3—3 thereof.

FIG. 4 is an exploded perspective view of the array of FIG. 1 showing the internal parts.

DESCRIPTION OF THE PREFERRED EMBODIMENT

A multiple flash lamp unit 17 of the planar array type and containing a plurality of electrically fired flash lamps is provided with a plug-in connector tab 18 at the lower end thereof, adapted to fit into a socket of a camera or flash adapter as shown and described in U.S. Pat. No. 3,952,320 to Blount. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect.

The general construction of the array comprises front and back housing members 36 and 37, which preferably are made of plastic and are provided with interlocking members 38 which can be molded integrally with the housing members and which lock the housing members together in final assembly to form a unitary flash array structure. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a printed circuit board 42 provided with integral connector tabs 18 and 18', and a combined shield and indicia sheet 43 which may be provided with instructions, information, and other indicia such as flash indicators located behind the respective lamps and which change color due to heat and/or light radiation from a flashing lamp, thus indicating at a glance which of the lamps have been flashed and not flashed.

The indicia sheet 43 may be of paper or thin cardboard coated with a layer of metal such as aluminum on its front or inner surface to function as a shield, and provided with openings where the flash indicators are desired, and flash indicator material 48, such as a sheet-like heat-sensitive plastic material, for example biaxially oriented polypropylene, which shrinks or melts when subjected to heat or radiant energy from an adjacent flashing lamp, is positioned over the flash indicator openings thus effectively changing the color of the openings in the indicia sheet 43. For example, the plastic material can be colored green on its back side by ink or other suitable means, and the green disappears and the opening becomes a different color (dark, for example)

when the plastic shrinks or melts away due to heat from an adjacent flashing lamp. The front of the plastic (toward the lamps) should be coated with dark ink so as to absorb heat more readily. Further details of the flash indicators are disclosed in the above-referenced Hanson patent. Window means 51 in the form of openings or transparent areas are provided through the circuit board 42 to facilitate radiation from flashing lamps reaching the flash indicators. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

In accordance with the invention, the circuit board 42 is made of a material which is electrically insulative and light reflective, for example polystyrene containing about one to ten percent by weight of titanium dioxide dispersed therein. Thus, the front surface of the circuit board functions as a reflector for the flash lamps, and can also function to carry circuitry for controlling the sequential flashing of the lamps, as will be described.

The height and width of the rectangular array are substantially greater than its thickness, and the height and width of the circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contracting terminals of a camera socket for applying firing voltage pulses to the array. Each tab is provided with a third terminal 33 and 33', respectively, which functions to electrically short the circuitry of the inactive lower group of lamps, when the array is plugged into a socket, as is described in the above referenced Blount patent. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed in U.S. Pat. no. 3,980,876 to Cote.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., may be attached to the circuit board 42 in various ways, such as by means of metal eyelets 22a', 22b', etc., placed through openings in the board. The lead wires 22a, 22b, etc., pass into or through the respective pairs of eyelets 22a', 22b', etc., and the ends of the eyelets are crimped or bent to hold the lead wires and made electrical contact thereto and also to hold the eyelets in place with their heads in electrical contact with the circuit of the circuit board.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25 and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. A suitable material for the radiation switches is silver oxide dispersed in a binder such as polyvinyl resin. Another suitable radiation switch material is disclosed in U.S. Pat. No. 3,990,832 to Smialek et al. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undersirable red-eye effect.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector table 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 2000 volts for example, at low current, for flashing, and they can be fired by impacting or stressing a piezoelectric element in the camera. A barrier or baffle strip 67, which may be of opaque plastic, is positioned between the columns of lamps, to prevent "sympathetic" flashing of lamps by heat or light radiation from the lamp beside it when flashed.

As explained above, in accordance with the invention the circuit board 42 is made from a light-reflective material, such as a plastic containing titanium dioxide which provides a white opaque board having a reflective surface. The board also may be tinted a light color to provide desired color characteristics of the reflected light. Preferably the circuit runs 64, 65, etc. on the front surface of the circuit board are relatively narrow so as not to unduly obstruct the reflection of light. Also, the circuit runs 64, 65, etc. may be of light-reflecting metal, such as aluminum or other metals, so as to contribute to the reflected light when the lamps are flashed. The circuit runs, being located over the reflective surface of the circuit board, and especially if they are of reflective material, result in good reflector results without having to resort to providing the circuit runs on the back of the board nor to providing an enlarged board having separate areas to accommodate the circuit runs.

Since the circuit board reflecting surface is flat, or substantially flat, it reflects light from the lamps when flashed over a wide range of angles, so that some of the reflected light falls outside of the camera's picture angle and is wasted insofar as illuminating the picture. Also, the light emanating directly from a flashing lamp covers a wide range of angles and some of this light falls outside of the camera's picture angle. A typical camera lens has a viewing angle of about 40°.

Some of the direct and reflected light from a flashing lamp that would be wasted, can be diverted into the camera's picture-taking angle by providing lenses or or prisms in front of the lamps and reflectors. The drawing shows an arrangement of prisms on the front cover 36 of the array for refracting some of the widely divergent light rays inwardly and into the camera's picture angle, thereby increasing the amount of useful illumination on the scene being photographed. The prism arrangement shown is generally similar to the prism arrangement disclosed in the above-referenced Schindler and Soules patent application.

The inside surface of the front cover 36 is shaped to define groups of elongated mutually parallel prisms 71 in front of each lamp and its associated circuit board reflector area. The groups 71 of prisms are parallel and symmetrically disposed with respect to the axes of the of the tubular flash lamps 22, etc. and are beveled so as to refract inwardly, i.e., in a direction more directly in front of the flash array, some of the widely divergent light from the flashing lamp and thus increase the illumination on the scene being photographed. For example, light ray 72 which is reflected by the circuit board 42 at an angle outside of the camera's picture-taking angle, is refracted into the camera's picture-taking angle, as indicated at 72'. Also, light rays 81 and 82 coming directly from a flashing lamp at angles outside the camera's picture-taking angle are refracted into the picture-taking angle as indicated at 81' and 82'.

The front surface of the cover 36 is contoured in the form of groups of prisms 86 and 87 in front of each lamp and reflector area, and respectively across the upper and lower portions of the lamp, these prisms being perpendicular to the lamp axis and each group thereof being arranged symmetrically as shown so as to refract some of the vertically divergent light rays into the camera's picture-taking angle, in a manner similar to the above-described functioning of the groups of prisms 71. For example, a light ray 85 reflected by the circuit board 42 and having a vertical angle outside the camera's picture-taking angle, will be refracted within the picturetaking angle, as indicated at 85'. A light ray 88 emanating from a point 89 of the flashing lamp 23 at an angle such that it would not illuminate the picture scene, is refracted as indicated at 88' so that it will illuminate the scene. Some light rays such as rays 91, 92, and 93, which are at angles within the camera's picture-taking angle, will be refracted to other angles within the picture-taking angle of the camera. Also, some light rays will become refracted from within to without the camera's picture-taking angle; however, more total light is refracted into the picture-taking angle than out of it.

The reflective circuit board of the invention reduces manufacturing cost, due to elimination of the customary separate reflector unit inserted between the lamps and circuit board, and, although not as efficient as a parobolic shaped reflector, the useful light output can be made comparable by providing prisms on the front cover, and by using slightly larger flash lamps which can be accommodated because of elimination of the reflector unit, in an array of the same physical size.

While preferred embodiments of the invention have been shown and described, various other embodiments and modifications thereof will become apparent to persons skilled in the art and will fall within the scope of the invention as defined in the following claims.

I claim:

1. A photoflash lamp array comprising a plurality of flash lamps, and a circuit board carrying circuitry for sequentially firing said flash lamps, said flash lamps being positioned over a surface of said circuit board and connected electrically to said circuitry, said circuit board being made of an electrically insulative light-reflecting material, said surface of the circuit board functioning as a reflector of light from said lamps when flashed.

2. An array as claimed in claim 1, in which said circuit board material is polystyrene containing titanium dioxide interspersed therein.

3. An array as claimed in claim 2, in which the amount of said titanium dioxide is about one to ten percent by weight of said polystyrene.

4. An array as claimed in claim 1, including a light-transmissive cover in front of said lamps and circuit board, one or both surfaces of said cover being provided with prism means for increasing the illumination in a picture-scene area when said lamps are flashed.

5. An array as claimed in claim 1, in which said circuitry comprises electrically conductive circuit runs on said surface of the circuit board and over portions of the areas thereof which reflect light when the lamps are flashed.

6. An array as claimed in claim 5, in which said circuit runs are made of light-reflecting material.

* * * * *